(12) United States Patent
Khoini-Poorfard et al.

(10) Patent No.: US 8,145,172 B2
(45) Date of Patent: Mar. 27, 2012

(54) LOW-COST RECEIVER USING TRACKING FILTER

(75) Inventors: Ramin Khoini-Poorfard, Austin, TX (US); Alessandro Piovaccari, Austin, TX (US); Aslamali A. Rafi, Austin, TX (US); Mustafa H. Koroglu, Austin, TX (US); David S. Trager, San Marcos, TX (US)

(73) Assignee: Silicon Laboratories Inc., Austin, TX (US)

( * ) Notice: Subject to any disclaimer, the term of this patent is extended or adjusted under 35 U.S.C. 154(b) by 753 days.

(21) Appl. No.: 12/277,866

(22) Filed: Nov. 25, 2008

(65) Prior Publication Data

US 2010/0130158 A1    May 27, 2010

(51) Int. Cl.
    *H04B 1/06* (2006.01)
(52) U.S. Cl. .......... 455/266; 455/339; 455/340
(58) Field of Classification Search .......... 455/255, 455/256, 266, 337, 339, 340
    See application file for complete search history.

(56) References Cited

U.S. PATENT DOCUMENTS

| | | | |
|---|---|---|---|
| 4,316,108 A * | 2/1982 | Rogers, Jr. | 327/553 |
| 4,364,116 A | 12/1982 | Nossek | |
| 5,737,035 A | 4/1998 | Rotzoll | |
| 6,177,964 B1 | 1/2001 | Birleson et al. | |
| 6,266,522 B1 * | 7/2001 | Holden et al. | 455/339 |
| 6,377,315 B1 | 4/2002 | Carr et al. | |
| 6,377,788 B1 * | 4/2002 | Elder et al. | 455/266 |
| 6,453,157 B1 * | 9/2002 | Roberts | 455/337 |
| 6,535,722 B1 * | 3/2003 | Rosen et al. | 455/188.2 |
| 6,549,096 B2 | 4/2003 | Groves et al. | |
| 6,681,102 B1 * | 1/2004 | Collier et al. | 455/296 |
| 6,778,117 B1 | 8/2004 | Johnson | |
| 6,915,114 B2 * | 7/2005 | Khorram | 455/67.14 |
| 6,917,328 B2 | 7/2005 | Rabinowitz | |
| 7,039,385 B1 * | 5/2006 | Hoffmann et al. | 455/340 |
| 7,158,774 B2 * | 1/2007 | Helio et al. | 455/340 |
| 7,231,192 B2 * | 6/2007 | Suzuki et al. | 455/130 |
| 7,305,223 B2 | 12/2007 | Liu et al. | |
| 7,327,406 B2 | 2/2008 | Utsunomiya | |
| 7,395,548 B2 * | 7/2008 | Runzo | 725/107 |
| 7,577,413 B2 * | 8/2009 | He et al. | 455/226.1 |
| 7,620,379 B2 * | 11/2009 | Isaac et al. | 455/130 |
| 2006/0064725 A1 | 3/2006 | Rabinowitz | |
| 2007/0165143 A1 | 7/2007 | Utsunomiya | |

OTHER PUBLICATIONS

"Applications of Switched-Capacitor Circuits in Active Filters and Instrumentation Amplifiers," Dr. William R. Grisé, Department of IET, Morehead State University, Technology Interface, vol. 3 No. 3, Fall 1999, ISSN# 1523-9926.

(Continued)

*Primary Examiner* — Lincoln Donovan
*Assistant Examiner* — William Hernandez
(74) *Attorney, Agent, or Firm* — Polansky & Associates, P.L.L.C.; Paul J. Polansky

(57) ABSTRACT

A receiver (400) includes a tracking bandpass filter (420) and a signal processing circuit (430-480). The tracking bandpass filter (420) has a first input for receiving a radio frequency (RF) signal, and an output, and includes a first portion (731) on a semiconductor die (730), and at least one inductor (721). The at least one inductor (721) is operatively coupled to the first portion of the tracking bandpass filter (420). The signal processing circuit (430-480) has an input coupled to the output of the tracking bandpass filter (420), and an output for providing a processed signal. The semiconductor die (730) and the at least one inductor (721) are integrated into a single multi-chip module (MCM) (710).

20 Claims, 7 Drawing Sheets

OTHER PUBLICATIONS

"Novel LC Pseudo Switched Capacitor Filter Suited for Wireless RF Applications," Ahmed El Oualkadi et al., IEICE Electronics Express, vol. 2, No. 8, Apr. 2005, pp. 286-291.

Actions on the Merits for Copending U.S. Appl. 12/277,908, filed Nov. 25, 2008.

* cited by examiner

LOW-COST RECEIVER USING TRACKING FILTER

CROSS REFERENCE TO RELATED, COPENDING APPLICATION

Related subject matter is found in a copending patent application entitled "Low-Cost Receiver Using Tracking Bandpass Filter and Lowpass Filter," application Ser. No. 12/277,908, invented by Ramin K. Poorfard, filed of even date herewith and assigned to the assignee hereof.

FIELD OF THE DISCLOSURE

The present disclosure relates generally to a radio frequency (RF) receiver and, more particularly relates to an RF receiver using a tracking filter.

BACKGROUND

Radio frequency (RF) receivers are used in a wide variety of applications such as television receivers, cellular telephones, pagers, global positioning system (GPS) receivers, cable modems, cordless phones, satellite radio receivers, and the like. As used herein, a "radio frequency" signal means an electrical signal conveying useful information and having a frequency from about 3 kilohertz (kHz) to thousands of gigahertz (GHz), regardless of the medium through which such signal is conveyed. Thus an RF signal may be transmitted through air, free space, coaxial cable, fiber optic cable, etc. One common type of RF receiver is the so-called superheterodyne receiver. A superheterodyne receiver mixes the desired data-carrying signal with the output of tunable oscillator to produce an output at a fixed intermediate frequency (IF). The fixed IF signal can then be conveniently filtered and converted back down to baseband for further processing. Thus a superheterodyne receiver requires two mixing steps.

For example, a television receiver may translate one channel in the band of 48 megahertz (MHz) to 870 MHz to an intermediate frequency of 44 MHz. And within the United States, FM radios will typically translate FM audio signals, which are broadcast in 200 KHz channels in the frequency band from 88.1 MHz to 107.9 MHz, to an intermediate frequency of 10.7 MHz. Because of the wide frequency range required of television receivers, it has been difficult to design high quality television receivers at low cost.

High quality television receivers have been traditionally formed with discrete components such as inductors, varactors, and capacitors. While the performance of these receivers has been good, they are expensive and bulky. It would be desirable to utilize the cost advantage of modern integrated circuit technologies. Unfortunately, existing silicon-based television tuners do not perform as well as discrete tuners and have not become significant in the marketplace. Moreover, television receivers that do use integrated circuit technology while retaining acceptable performance have still required external, discrete components, adding to their cost. Thus the promise of integrated circuit technology in reducing the cost of television receivers has not been fully realized.

What is needed, then, are new receiver architectures for applications such as television receivers that retain the high performance of discrete receivers but also take advantage of the reduction in cost afforded by integrated circuit technology.

SUMMARY

According to one embodiment, a receiver includes a tracking bandpass filter and a signal processing circuit. The tracking bandpass filter has a first input for receiving a radio frequency (RF) input signal, and an output. The tracking bandpass filter includes a first portion disposed on a semiconductor die, and at least one inductor. The at least one inductor is operatively coupled to the first portion of the tracking bandpass filter. The signal processing circuit has an input coupled to the output of the tracking bandpass filter, and an output for providing a processed signal. The semiconductor die and the at least one inductor are integrated into a single multi-chip module (MCM).

According to another embodiment, a receiver includes a tracking bandpass filter, a power detector, a signal processing circuit, and a microcontroller. The tracking bandpass filter has a first input for receiving a radio frequency (RF) input signal, a second input for receiving a center frequency adjustment signal, and an output. The tracking bandpass filter includes a first portion disposed on a semiconductor die, and at least one inductor disposed on an integrated passive device (IPD). The at least one inductor is operatively coupled to the first portion of the tracking bandpass filter. The power detector includes an input coupled to the output of the tracking bandpass filter, and an output. The signal processing circuit includes an input coupled to the output of the tracking bandpass filter, and an output for providing a processed signal. The microcontroller includes an input coupled to the output of the power detector, and an output coupled to the second input of the tracking bandpass filter for adjusting a center frequency of the tracking bandpass filter. The semiconductor die and the IPD die are integrated into a single multi-chip module (MCM).

According to yet another embodiment, a receiver includes a low noise amplifier, a tracking bandpass filter, a local oscillator, a mixer, a signal processing circuit and a microcontroller. The low noise amplifier includes a first input for receiving a radio frequency (RF) input signal, a second input for receiving a gain adjustment signal, and an output. The tracking bandpass filter includes a first input coupled to the output of the low noise amplifier, a second input for receiving a center frequency adjustment signal, and an output. The tracking bandpass filter includes a first portion disposed on a semiconductor die, and at least one inductor disposed on an integrated passive device (IPD). The at least one inductor is operatively coupled to the first portion of the tracking bandpass filter. The local oscillator includes an input for receiving a local oscillator frequency adjustment signal, and an output for providing a local oscillator signal at a frequency chosen to mix the output of the tracking bandpass filter to a desired intermediate frequency (IF). The mixer includes a first input coupled to the output of the tracking bandpass filter, a second input coupled to the output of the local oscillator, and an output for providing an IF signal at the desired intermediate frequency. The signal processing circuit includes an input coupled to the output of the mixer, and an output for providing a processed signal. The microcontroller includes a first output coupled to the second input of the low noise amplifier for adjusting the gain of the low noise amplifier, a second output coupled to the second input of the bandpass filter for adjusting the center frequency of the bandpass filter, and a third output coupled to the input of the local oscillator for adjusting the local oscillator frequency of the local oscillator. The semiconductor die and the IPD die are integrated into a single multi-chip module (MCM).

BRIEF DESCRIPTION OF THE DRAWINGS

The present disclosure may be better understood, and its numerous features and advantages made apparent to those skilled in the art by referencing the accompanying drawings, in which.

The use of the same reference symbols in different drawings indicates similar or identical items.

DETAILED DESCRIPTION

In general, a receiver as described herein uses a tracking bandpass filter for channel tuning. The tracking bandpass filter includes an inductor that is fabricated on an integrated passive device (IPD) die. The receiver combines the IPD die and a main integrated circuit die into a single multi-chip module (MCM). Thus to the user the receiver appears to be a single integrated circuit. However the IPD die is well suited to building inductors without using the relatively more-expensive silicon manufacturing process. Thus, high quality, low cost, and compact size are obtained simultaneously.

Figure 1:
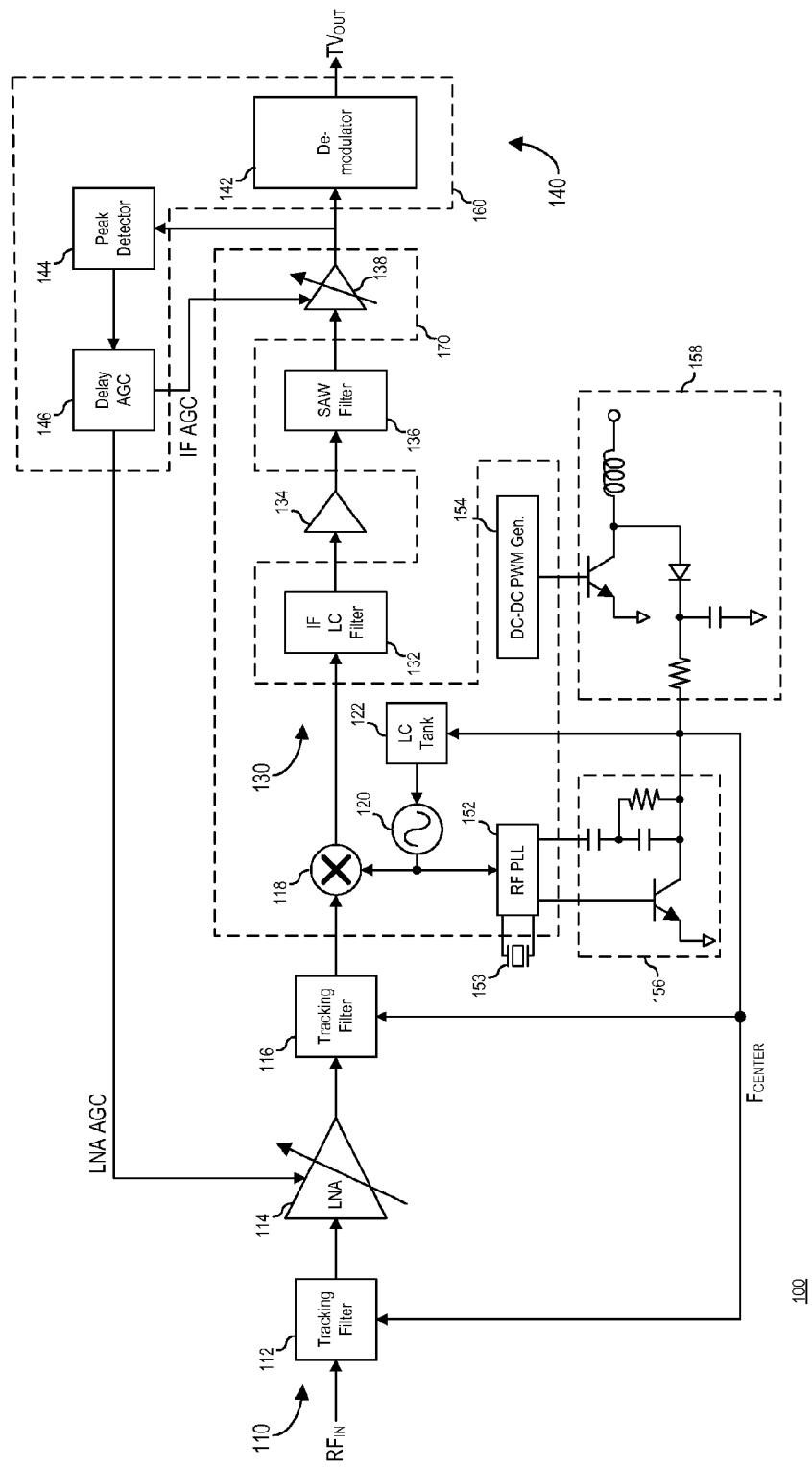
FIG. 1 illustrates in partial block diagram and partial schematic form a first television receiver known in the prior art.

In order to understand the difficulty of known receiver designs to simultaneously achieve both high quality filtering and low cost, reference is now made to FIG. 1, which illustrates in partial block diagram and partial schematic form a first television receiver 100 known in the prior art. Receiver 100 includes one or more radio frequency (RF) sections 110, an intermediate frequency (IF) section 130, a demodulator section 140, a radio frequency (RF) phase-locked loop (PLL) 152, a crystal 153, a DC-to-DC pulse width modulation (PWM) generator 154, a loop filter 156, and a varactor voltage control circuit 158. RF section 110 includes a tracking filter 112, a low-noise amplifier (LNA) 114, a tracking filter 116, a mixer 118, a local oscillator 120, and a tank circuit 122. IF section 130 includes an intermediate frequency (IF) filter 132, an IF gain stage 134, a surface acoustic wave (SAW) filter 136, and a variable gain IF gain stage 138. Demodulator section 140 includes a demodulator 142, a peak detector 144, and a delay automatic gain control (AGC) 146.

Tracking filter 112 has a first input for receiving a radio frequency (RF) input signal labeled "$RF_{IN}$", a second input for receiving a center frequency adjustment voltage labeled "$F_{CENTER}$", and an output. LNA 114 has a first input connected to the output of tracking filter 112, a second input for receiving a gain control signal labeled "LNA AGC", and an output. Tracking filter 116 has a first input connected to the output of LNA 114, a second input for receiving voltage $F_{CENTER}$, and an output. Mixer 118 has a first input connected to the output of tracking filter 116, a second input, and an output. IF filter 132 has an input connected to the output of mixer 118, and an output. IF gain stage 134 has an input connected to the output of IF filter 132, and an output. SAW filter 136 has an input connected to the output of IF gain stage 134, and an output. Variable gain IF gain stage 138 has a first input connected to the output of SAW filter 136, a second input, and an output. Demodulator 142 has an input connected to the output of variable gain IF gain stage 138, and an output for providing a demodulated output signal labeled "$TV_{OUT}$".

Peak detector 144 has an input connected to the output of variable gain IF gain stage 138, and an output. Delay AGC 146 has an input connected to the output of peak detector 144, a first output for providing a gain adjustment signal labeled "IF AGC" connected to the second input of variable gain IF gain stage 138, and a second output for providing signal LNA AGC connected to the second input of LNA 114.

RF PLL 152 has a first input, a second input connected to crystal 153, a first output and a second output. Loop filter 156 has a first input connected to the first output of RF PLL 152, a second input connected to the second output of RF PLL 152, and an output for providing voltage $F_{CENTER}$ connected to the second input of tracking filter 112 and to the second input of tracking filter 116. DC-DC PWM GENERATOR 154 has an output. Varactor voltage control circuit 158 has an input connected to the output of DC-DC PWM GENERATOR 154, and an output connected to the output of loop filter 156. Tank circuit 122 has an input for receiving voltage $F_{CENTER}$ from the output of loop filter 156, and an output. Local oscillator 120 has an input connected to the output of tank circuit 122, and an output connected to the second input of mixer 118 and also connected to the input of RF PLL 152.

Receiver 100 exhibits a degree of integration wherein mixer 118, IF gain stage 134, variable gain IF gain stage 138, local oscillator 120, RF PLL 152 and DC-DC PWM generator 154 are included in a single integrated device known as a MOPLL 170 (i.e., Mixer, Oscillator, PLL). Further, demodulator 142, peak detector 144, and delay AGC 146 are included in a single integrated device known as a demodulator die 160. Receiver 100 also includes several discrete elements, including tracking filter 112, LNA 114, tracking filter 116, IF filter 132, SAW filter 136, the circuit elements of the loop filter 156 and the varactor voltage control circuit 158.

In operation, signal $RF_{IN}$ is a broadband signal that includes energy from several television signals modulated onto carrier waves at different frequencies. The different carrier waves constitute the television channels from which television content can be received. Signal $RF_{IN}$ can be received from an antenna, or from a cable television connection. Tuning into a desired television channel involves passing signal $RF_{IN}$ through tracking filter 112 and tracking filter 116 to reduce the energy from the television signals modulated onto carrier waves outside of the desired television channel carrier wave frequency band. Tracking filter 112 and tracking filter 116 include inductors and capacitors configured to give the desired order of bandpass L-C (i.e., inductor-capacitor) filter response. LNA 114 is included to amplify the tuned signal while introducing minimal noise products. Mixer 118 mixes the tuned signal with the output from local oscillator 120 and produces sum and difference output frequencies:

$$f_1 = f_{CW} + f_{LO} \quad [1]$$

and $$f_2 = f_{CW} - f_{LO} \quad [2]$$

where $f_{CW}$ is the frequency of the desired carrier wave of the tuned signal, and $f_{LO}$ is the local oscillator frequency. Local oscillator 120 has an output frequency that is set by tank circuit 122. Tank circuit 122 is a resonant L-C circuit. The signal component $f_1$ is a higher frequency signal that is filtered out by IF filter 132. IF filter 132 is a lowpass L-C filter.

The component $f_2$ is an intermediate frequency IF signal that includes the desired channel at a selected IF that is passed by IF filter 132. The IF signal is further conditioned by IF gain stage 134, SAW filter 136, and variable gain IF gain stage 138 before being demodulated into signal $TV_{OUT}$ by demodulator 160. Peak detector 144 detects power levels at the input of demodulator 142, and provides feedback input to delay AGC 146 which adjusts the gain at LNA 114 and variable gain IF gain stage 138, so that the power level of the tuned RF signal is not too high or too low.

In order to have the ability to tune in more than one television channel, receiver 100 includes a tuning mechanism that adjusts the center frequency of tracking filter 112 and tracking filter 116, and the frequency of the output of local oscillator 120. Tracking filter 112, tracking filter 116, and tank circuit 122 include high quality inductors that are typically air wound, and are not easily tuned to change circuit performance. On the other hand, the capacitors are implemented with varactors, that is, reverse-biased diodes designed such that the capacitance varies with the applied voltage. The varactors are thus tunable by varying the applied reverse-bias voltage. The reverse-bias voltage used to achieve the desired capacitance can be up to 30 volts (V) or higher. Loop filter 156 and varactor voltage control circuit 158 serve to adjust the voltage applied to the varactors in tracking filter 112, tracking filter 116, and tank circuit 122 to tune to the various television channels.

Receiver 100 includes features which are not easily adaptable to higher levels of integration. In particular, tracking filter 112, tracking filter 116, and tank circuit 122 include high quality inductors that are typically hand tuned at the time of manufacture to ensure proper tuning performance in operation. Additionally, the use of varactors requires the addition of the components associated with loop filter 156, and with varactor voltage control circuit 158 and DC-DC PWM generator 154, which together function as a DC-to-DC converter. Also, use of SAW filter 136 increases both the cost and the physical size of receiver 100. Receiver 100 also requires wide tuning ranges for tracking filter 112, tracking filter 116, and local oscillator 120.

Figure 2:
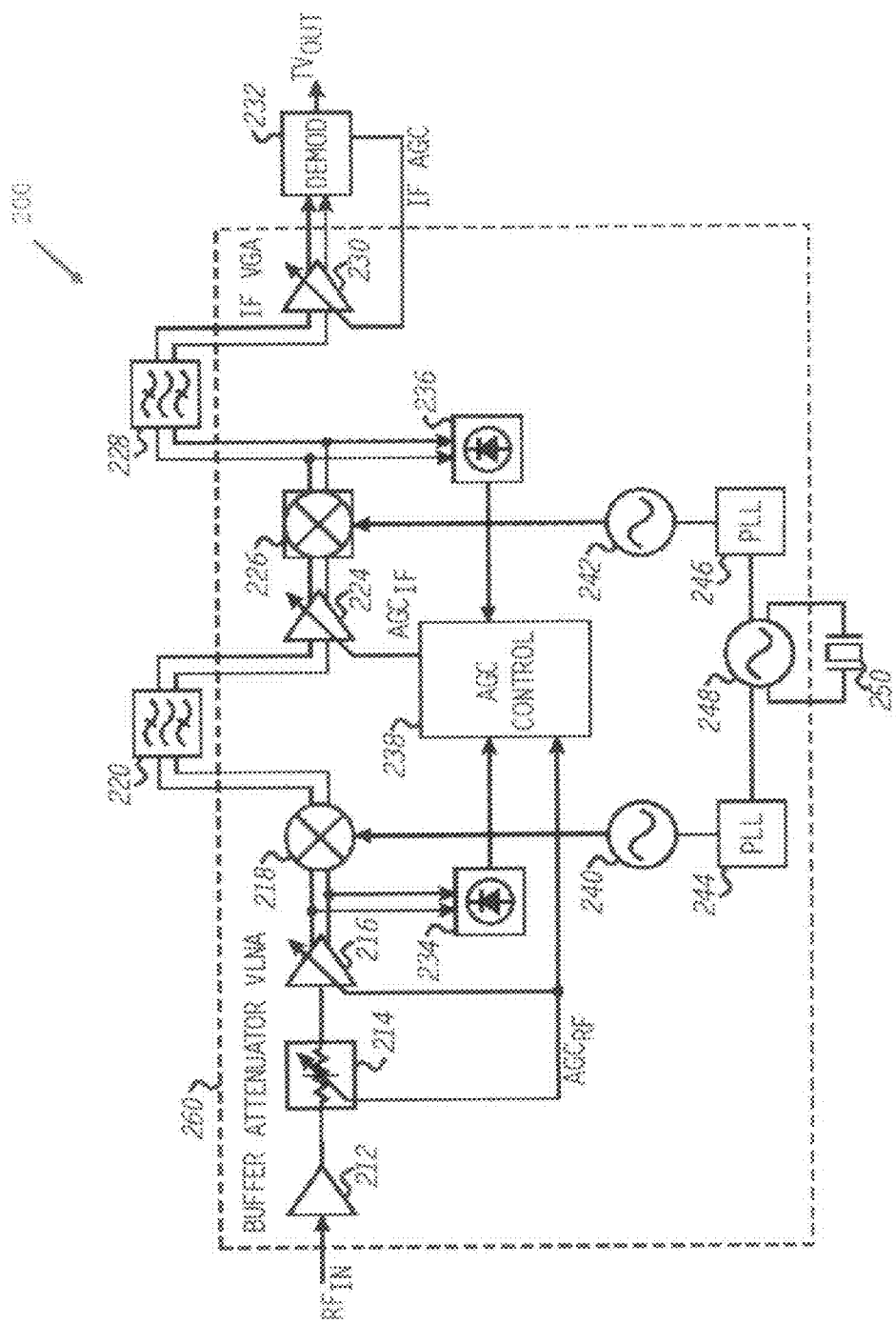
FIG. 2 illustrates in partial block diagram and partial schematic form a second television receiver known in the prior art.

Another known receiver architecture is shown in FIG. 2, which illustrates in partial block diagram and partial schematic form a second television receiver 200 known in the prior art. Receiver 200 is an up-down receiver and includes a buffer 212, an attenuator 214, a variable low-noise amplifier (VLNA) 216, an RF mixer 218, a SAW filter 220, a variable gain IF amplifier 224, an IF mixer 226, a SAW filter 228, a variable gain IF amplifier 230, a demodulator 232, power detectors 234 and 236, an automatic gain control (AGC) circuit 238, local oscillators 240 and 242, phase-locked loops (PLLs) 244 and 246, a crystal oscillator 248, and a crystal 250.

Buffer 212 has an input for receiving an RF input signal $RF_{IN}$, and an output. Attenuator 214 has a first input connected to the output of buffer 212, a second input, and an output. VLNA 216 has a first input connected to the output of attenuator 214, a second input, and an output. RF mixer 218 has a first input connected to the output of VLNA 216, a second input, and an output. SAW filter 220 has an input connected to the output of RF mixer 218, and an output. Variable gain IF amplifier 224 has a first input connected to the output of SAW filter 220, a second input, and an output. IF mixer 226 has a first input connected to the output of variable gain IF amplifier 224, a second input, and an output. SAW filter 228 has an input connected to the output of IF mixer 226, and an output. Variable gain IF amplifier 230 has a first input connected to the output of SAW filter, a second input, and an output. Demodulator 232 has an input connected to the output of variable gain IF amplifier 230, a first output for providing a demodulated output signal $TV_{OUT}$, and a second output for providing an AGC signal IF AGC connected to the second input of the variable gain IF amplifier 230.

Power detector 234 has an input connected to the output of VLNA 216, and an output. Power detector 236 has an input connected to the output of IF mixer 226, and an output. AGC circuit 238 has a first input connected to the output of power detector 234, a second input connected to the output of power detector 236, a first output for providing an AGC signal labeled "$AGC_{RF}$" connected to the second input of attenuator 214 and also connected to the second input of VLNA 216, and a second output for providing an AGC signal labeled "$AGC_{IF}$" connected to the second input of variable gain IF amplifier 224. Crystal oscillator 248 is connected to crystal 250, and has a first output and a second output. PLL 244 has an input connected to the first output of crystal oscillator 248, and an output. Local oscillator 240 has an input connected to the output of PLL 244 and an output connected to the second input of RF mixer 218. PLL 246 has an input connected to the second output of crystal oscillator 248, and an output. Local oscillator 242 has an input connected to the output of PLL 246 and an output connected to the second input of IF mixer 226. Receiver 200 exhibits a degree of integration wherein buffer 212, attenuator 214, variable low-noise amplifier (VLNA) 216, RF mixer 218, variable gain IF amplifier 224, IF mixer 226, variable gain IF amplifier 230, power detectors 234 and 236, AGC circuit 238, local oscillators 240 and 242, phase-locked loops (PLLs) 244 and 246, and crystal oscillator 248 are combined on a single integrated circuit die 260.

Here, rather than tuning tracking bandpass filters and tank circuits to filter out all but the desired channel, receiver 200 mixes the broadband $RF_{IN}$ signal with a local oscillator signal chosen to mix the desired channel to a high IF which is the center frequency of a highly selective bandpass filter (e.g., SAW filter 220). The high IF is above a desired IF, so receiver 200 then mixes the filtered signal to the desired IF. In operation, signal $RF_{IN}$ is adjusted to a level that will not overpower IF mixer 218 by first passing through buffer 212, attenuator 214 and VLNA 216. The power level at the input to RF mixer 218 is detected by power detector 234 and AGC circuit 238 provides a gain adjustment signal to attenuator 214 and VLNA 216 via signal $AGC_{RF}$. Mixer 118 combines the gain adjusted signal with the output from local oscillator 240, to produce sum and difference output frequencies:

$$f_1 = f_{RF} + f_{LO} \qquad [3]$$

and $$f_2 = f_{RF} - f_{LO} \qquad [4]$$

where $f_{RF}$ is the carrier frequency of a desired channel of signal $RF_{IN}$ and $f_{LO}$ is the local oscillator frequency. Local oscillator 240 is driven by PLL 244, which is adjusted such that the desired channel's spectrum is mixed into the passband of SAW filter 220. The signals $f_1$ and $f_2$ include components that correspond to the unfiltered signal $RF_{IN}$, but the undesired channel components are filtered out by SAW filter 220. The center frequency of SAW filter 220 is typically around 1 gigahertz (GHz). IF mixer 226 combines the output of SAW filter 220 with the output from local oscillator 242, to produce the desired IF signal, which passes through SAW filter 228 and variable gain IF amplifier 230 before being demodulated by demodulator 232 into signal $TV_{OUT}$.

Receiver 200, with the high selectivity of SAW filter 220 solves several problems with receiver 100, such as elimination of discrete high quality inductors, varactors and the associated DC-DC converter, and reduction of the LO tuning range. However, receiver 200 has introduced an additional discrete component, SAW filter 228, so the reduction in overall size is minor. Furthermore, the addition of the mixer 226 and PLL 246 to implement the up-down architecture makes the integrated circuit die 260 larger. Also, the absence of tracking filters increases the linearity requirements for VLNA 216 and IF mixer 226, and results in greater power consumption.

Figure 3:
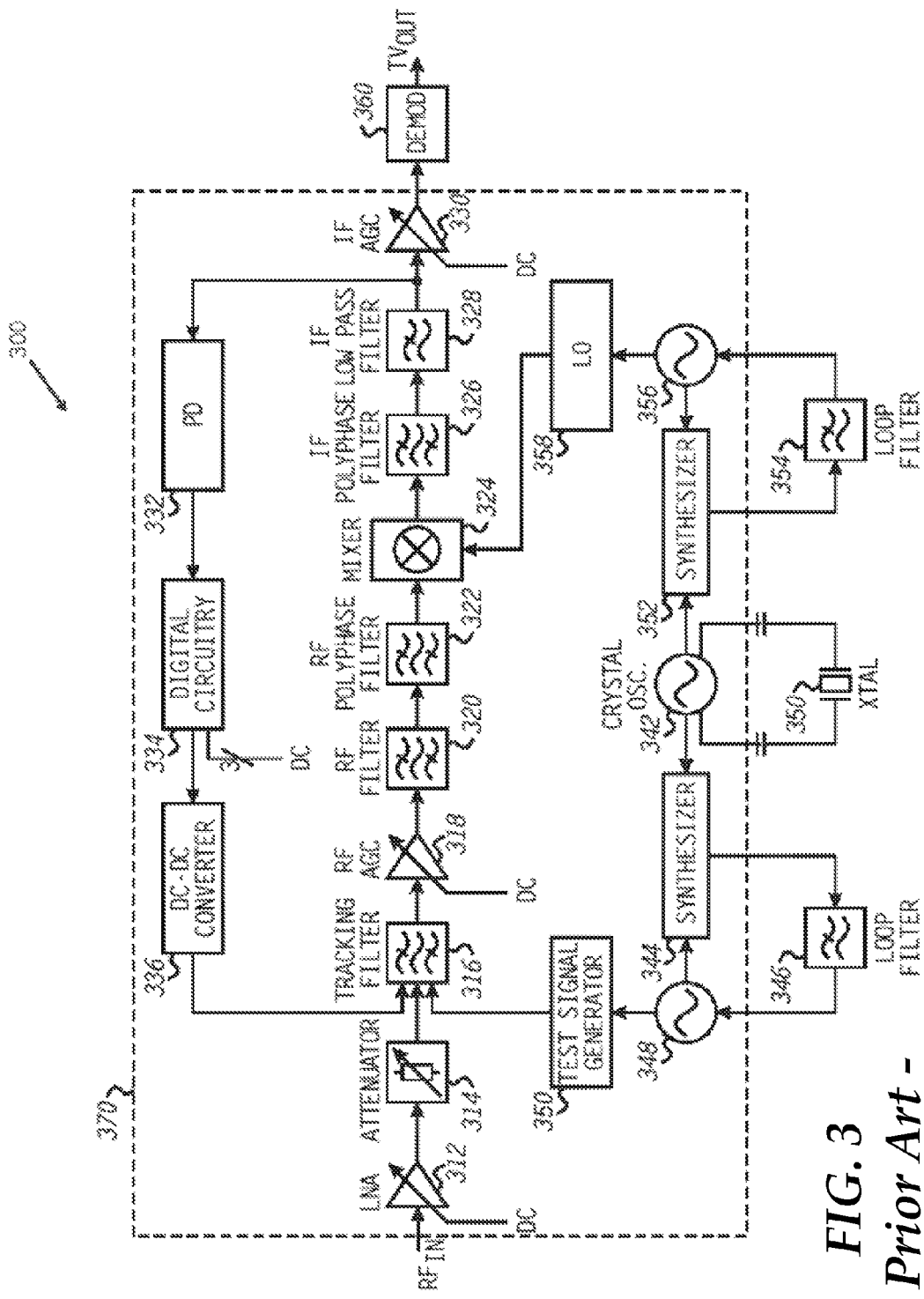
FIG. 3 illustrates in partial block diagram and partial schematic form a third television receiver known in the prior art.

FIG. 3 illustrates in partial block diagram and partial schematic form a third television receiver 300 known in the prior art. Receiver 300 includes a LNA 312, an attenuator 314, a tracking filter 316, an RF AGC amplifier 318, an RF filter 320, an RF polyphase filter 322, a mixer 324, an IF polyphase filter 326, an IF lowpass filter 328, an IF AGC amplifier 330, a power detector 332, a digital control circuit 334, a DC-DC converter 336, a crystal 340, a crystal oscillator 342, a synthesizer 344, a loop filter 346, an oscillator 348, a test signal generator 350, a synthesizer 352, a loop filter 354, an oscillator 356, and a local oscillator generator 358.

LNA 312 has a first input for receiving an RF input signal $RF_{IN}$, a second input, and an output. Attenuator 314 has an input connected to the output of LNA 312, and an output. Tracking filter 316 has a first input connected to the output of attenuator 314, a second input, and an output. RF AGC amplifier 318 has a first input connected to the output of tracking filter 316, a second input, and an output. RF filter 320 has an input connected to the output of RF AGC amplifier 318, and an output. RF polyphase filter 322 has an input connected to the output of RF filter 320, and an output. Mixer 324 has a first input connected to the output of RF filter 320, a second input, and an output. IF polyphase filter 326 has an input connected to the output of mixer 324, and an output. IF lowpass filter 328 has an input connected to the output of IF polyphase filter 326, and an output. IF AGC amplifier 330 has a first input connected to the output of IF lowpass filter 328, a second input, and an output. Demodulator 360 has an input connected to the output of IF AGC amplifier 330, and an output for providing a demodulated output signal $TV_{OUT}$.

Power detector 332 has an input connected to the output of IF lowpass filter 328, and an output. Digital control circuit 334 has an input connected to the output of power detector 332, a first output connected to the second input of LNA 312, the second input of RF AGC amplifier 318, and the second input of IF AGC amplifier 330, and a second output. DC-DC converter 336 has an input connected to the second output of digital control circuit 334, and an output connected to the second input of tracking filter 316.

Crystal 340 has first and second terminals. Crystal oscillator 342 has a first input connected through a capacitor to the first terminal of crystal 340, a second input connected through a capacitor to the second terminal of crystal 340, a first output, and a second output. Synthesizer 344 has a first input connected to the first output of crystal oscillator 342, a second input, and an output. Loop filter 346 has an input connected to the output of synthesizer 344, and an output. Oscillator 348 has an input connected to the output of loop filter 346, a first output connected to the second input of synthesizer 344, and a second output. Test signal generator 350 has an input connected to the second output of oscillator 348, and an output connected to the first input of tracking filter 316. Synthesizer 352 has a first input connected to the second output of crystal oscillator 342, a second input, and an output. Loop filter 354 has an input connected to the output of synthesizer 352, and an output. Oscillator 356 has an input connected to the output of loop filter 354, a first output connected to the second input of synthesizer 354, and a second output. Local oscillator generator 358 has an input connected to the second output of oscillator 356, and an output connected to the second input of mixer 324.

In operation, receiver 300 functions similarly to receiver 100, tuning into a desired television channel by passing signal $RF_{IN}$ through tracking filter 316 to attenuate the television channels outside of the desired passband. As such, tracking filter 316 includes inductors and varactors. Receiver 300 exhibits a further degree of integration over receivers 100 and 200, wherein LNA 312, attenuator 314, tracking filter 316, RF AGC amplifier 318, RF filter 320, RF polyphase filter 322, mixer 324, IF polyphase filter 326, IF lowpass filter 328, IF AGC amplifier 330, power detector 332, digital control circuit 334, DC-DC converter 336, crystal oscillator 342, synthesizer 344, oscillator 348, test signal generator 350, synthesizer 352, and oscillator 356 are combined on a system-in-package (SIP) receiver 370. In this approach, the inductors and varactors are surface mount devices (SMDs) soldered onto a laminate substrate along with a tuner die. The varactor SMDs are of a high voltage type, necessitating DC-DC converter 336, which operates at voltages up to 30 volts. Thus, in order to integrate DC-DC converter 336 onto the tuner die, the tuner die is implemented in a high voltage bipolar junction transistor complementary metal-oxide-silicon (HV BiCMOS) process.

To tune tracking filter 316, an off-line calibration tone is injected from test signal generator 350 into tracking filter 316, and the power level is measured at power detector 332. Because power measurement is done in the IF section, two tones are needed in order to tune tracking filter: the calibration tone, and the LO tone. Thus, two separate synthesizers are required to perform calibration. While receiver 300 achieves greater integration and a smaller footprint than receivers 100 and 200, the necessity of SMD inductors and varactors, and the expensive HV BiCMOS process means the cost savings are minimal compared to receivers 100 and 200. Additionally, the requirement to include DC-DC converter 336 and synthesizer 352 prevents further reduction in die size. Thus, further integration while maintaining high performance would be desirable.

Figure 4:
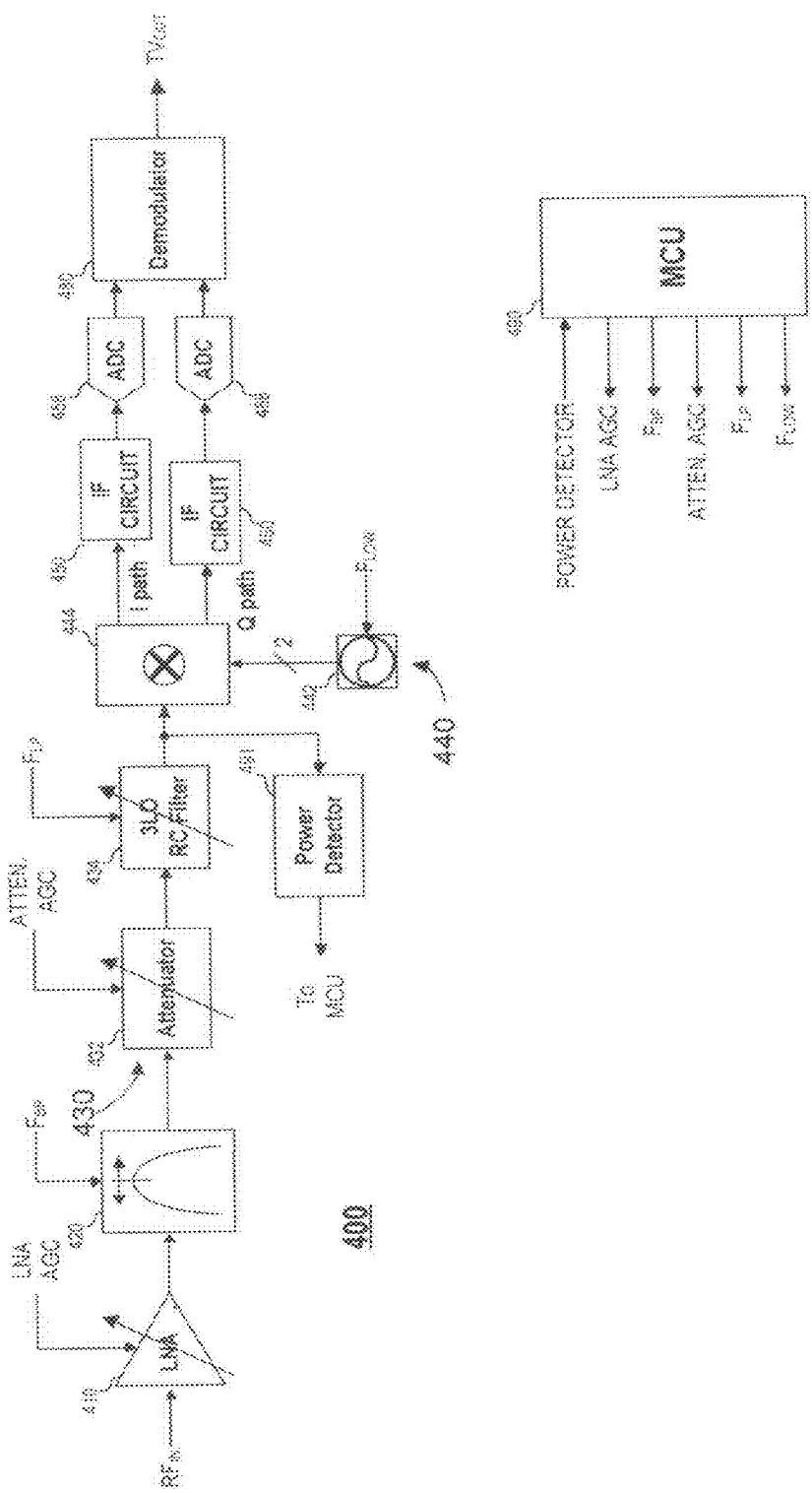
FIG. 4 illustrates in partial block diagram and partial schematic form a television receiver according to an embodiment of the present invention.

FIG. 4 illustrates in partial block diagram and partial schematic form a television receiver 400 according to an embodiment of the present invention. Receiver 400 includes generally a low noise amplifier (LNA) 410, a tracking bandpass filter 420, a preconditioning circuit 430, a mixing circuit 440, a first intermediate frequency (IF) processing circuit 450, a second IF processing circuit 460, a first analog-to-digital converter (ADC) 458, a second ADC 468, a demodulator 480, a microcontroller unit (MCU) 490, and a power detector 491. LNA 410 has a first input for receiving an RF input signal $RF_{IN}$, a second input for receiving a gain control signal LNA AGC, and an output. Tracking bandpass filter 420 has a first input connected to the output of LNA 410, a second input for receiving a tuning signal labeled "$F_{BP}$", and an output.

Preconditioning circuit 430 includes an attenuator 432 and a filter 434. Attenuator 432 has a first input connected to the output of tracking bandpass filter 420, a second input for receiving an attenuation control signal labeled "ATTEN AGC", and an output. Filter 434 has a first input connected to the output of attenuator 432, a second input for receiving a cutoff frequency adjustment signal labeled "$F_{LP}$", and an output.

Mixing circuit 440 includes a local oscillator 442, and a mixer 444. Local oscillator 442 has an input for receiving a local oscillator tuning signal labeled "$F_{LO}$", and a first output for providing two mixing signals, including an in-phase mixing signal and a quadrature mixing signal, and a second output for providing a test signal labeled "TEST" connected to the first input of tracking bandpass filter 420. Mixer 444 has a first input connected to the output of filter 434, a second input connected to the output of local oscillator 442, a first output for providing an in-phase IF signal, and a second output for providing a quadrature IF signal.

IF circuit 450 has an input connected to the first output of mixer 444, and an output. IF circuit 460 has an input connected to the second output of mixer 444, and an output. ADC 458 has an input connected to the output of IF circuit 450, and an output for providing a 3-bit digital output signal. ADC 468 has an input connected to the output of IF circuit 460, and an output for providing a 3-bit digital output signal. Demodulator 480 has inputs connected to the outputs of ADCs 458 and 468, and an output for providing a demodulated output signal $TV_{OUT}$.

MCU 490 has an input, and outputs for providing the LNA AGC, $F_{BP}$, ATTEN AGC, $F_{LP}$, and $F_{LO}$ control signals. Power detector 491 has an input connected to the output of filter 434, and an output connected to the input of MCU 490. MCU 490 can control receiver 400 by providing control signals LNA AGC, $F_{BP}$, ATTEN AGC, $F_{LP}$, and $F_{LO}$ as discrete outputs, as shown in FIG. 4, or by communicating the control signals over a serial interface from which they are received and driven.

In operation, receiver 400 functions as a television receiver adapted to receive and demodulate television channels. MCU 490 is adapted to control the various elements in receiver 400 according to the channel selected by the user. Receiver 400 uses a dual-filter architecture for the pre-mixing tuner. Signal $RF_{IN}$ is received and amplified as necessary in LNA 410 under the control of MCU 490 via signal LNA AGC. Receiver 400 is thus able to present a signal to the input of tracking bandpass filter 420 at a suitable level. Receiver 400 utilizes digital automatic gain control using power detector 491 and MCU 490.

Tracking bandpass filter 420 is a second-order LC filter that assists in providing image rejection by filtering neighboring channels, a significant part of whose energy could be reflected back into the passband. As will be described later with reference to FIG. 6, tracking bandpass filter 420 is implemented as an inductor with an array of switched capacitors, the selection of which functions to tune the center frequency of the passband of tracking bandpass filter 420 under the control of MCU 490 via signal $F_{BP}$. In calibrating tracking bandpass filter 420, a test signal is provided to the first input of tracking bandpass filter 420, and the power output of filter 434 is measured by power detector 491. As will be further described later with reference to FIG. 7, tracking bandpass filter 420 is implemented in part on an integrated circuit substrate containing the other elements of receiver 400, and part on an integrated passive device (IPD) die.

Attenuator 432 functions as a separately controllable gain element under the control of MCU 490 via signal ATTEN AGC such that MCU 490 can properly divide the attenuation between different portions of the signal processing path. Filter 434 provides additional attenuation above the third harmonic of the mixing signal under the control of MCU 490 via signal $F_{LP}$ to prevent unwanted energy from a neighboring channel from being mixed into the passband. This frequency is important because local oscillator 442 uses a digital mixing signal that is a square wave, which has significant energy at its third harmonic.

Mixer 444 is a quadrature mixer that mixes the filtered and attenuated RF input signal with the signal from local oscillator 442 to mix a selected channel to a desired IF. In receiver 400, the desired IF is selectable in the range of 3 to 5 megahertz (MHz), and thus receiver 400 is configurable as a low-IF architecture. Additionally, receiver 400 is also configurable as a direct down conversion receiver using zero IF. To achieve the desired IF, local oscillator 442 is tuned to a frequency that mixes the selected channel to the desired IF, under the control of MCU 490 via signal $F_{LO}$. In other embodiments, receiver 400 may use a high-IF architecture. After reading this disclosure, it will be appreciated that receiver 400 is configurable to be compatible with various television standards around the world.

Each of IF circuits 450 and 460 perform further signal conditioning, including lowpass filtering to pass signals below a cutoff frequency of between 7 and 9 MHz, and further gain stages under the control of MCU 490. ADCs 458 and 468 convert their respective input signals to the digital domain, such that demodulator 480 can demodulate them digitally and provide signal $TV_{OUT}$.

By using the tracking bandpass filter approach with an LC type filter, receiver 400 is able to obtain high quality filtering and low signal-to-noise ratio at low cost. The RF filtering is shared between tracking bandpass filter 420 and lowpass filter 434, which eases the quality required of tracking bandpass filter 420. The array of switched capacitors of tracking bandpass filter 420 is efficiently fabricated on a receiver die that also includes LNA 410, preconditioning circuit 430, mixing circuit 440, first intermediate frequency (IF) processing circuit 450, second IF processing circuit 460, first analog-to-digital converter (ADC) 458, second ADC 468, demodulator 480, microcontroller unit (MCU) 490, and power detector 491. Moreover, the inductors of tracking bandpass filter 420 are efficiently fabricated on an integrated passive device (IPD) die, as will be more fully explained with respect to FIG. 7 below. Thus, receiver 400 achieves high quality at low cost.

Figure 5:
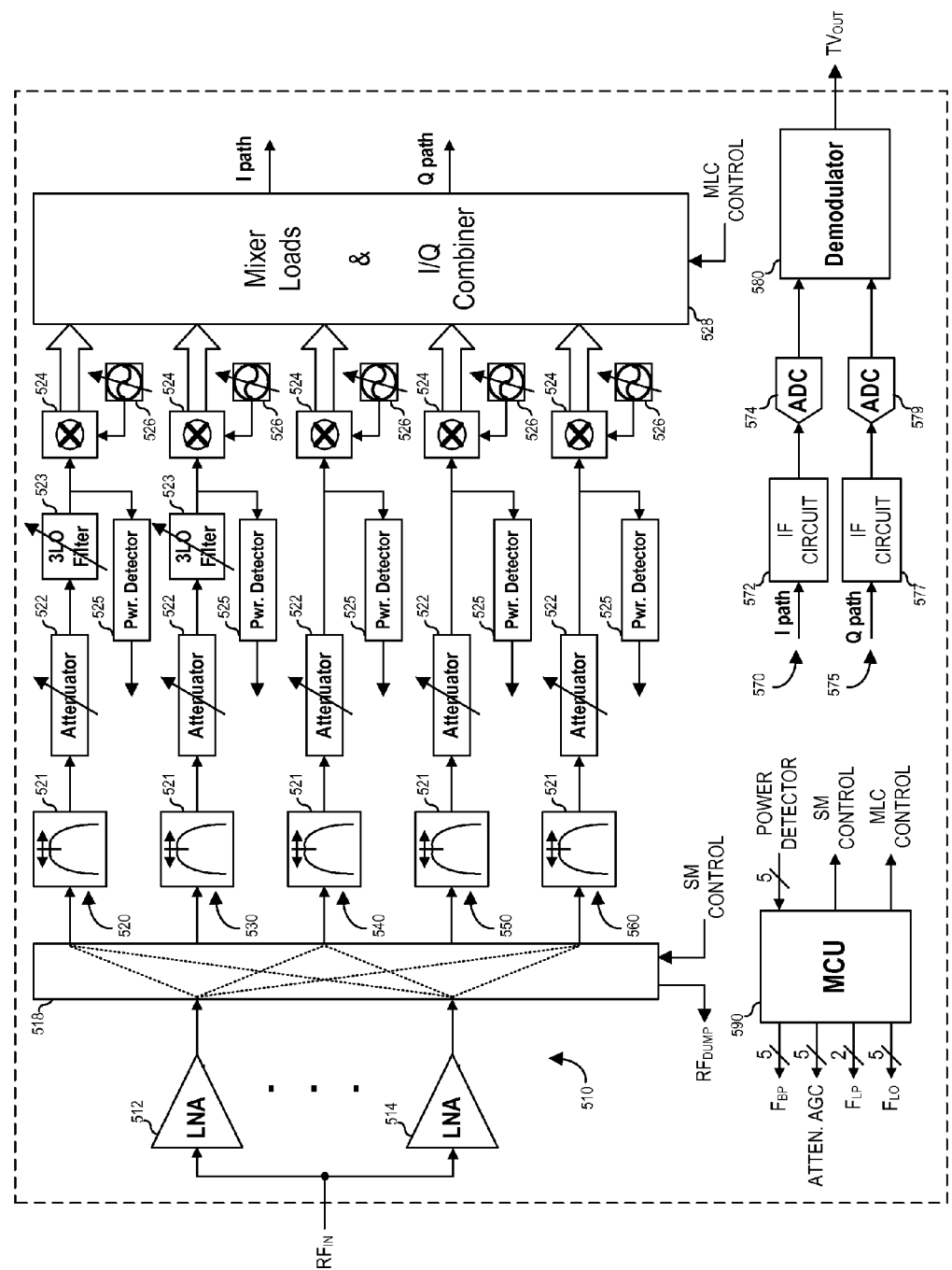
FIG. 5 illustrates in partial block diagram and partial schematic form a particular embodiment of the television receiver of FIG. 4.

FIG. 5 illustrates in partial block diagram and partial schematic form a particular embodiment of the television receiver 500 of FIG. 4. Receiver 500 includes an input section 510, first through fifth RF sections 520, 530, 540, 550, and 560, a mixer load/I/Q combiner 528, a first IF section 570, a second IF section 575, a demodulator 580 similar to demodulator 480, and an MCU 590 similar to MCU 490. Input section 510 includes a first LNA 512, one or more additional LNA, labeled generally as LNA 514, and a switch matrix 518. Each RF section 520, 530, 540, 550, and 560 includes a tracing bandpass filter 521 similar to tracking bandpass filter 420, an attenuator 522 similar to attenuator 532, a mixer 524 similar to mixer 444, a power detector 525 similar to power detector 491, and a local oscillator 526 similar to local oscillator 442. Further, first RF section 520, and second RF section 530 include a filter 523 similar to filter 434. IF section 570 includes an IF circuit 572 similar to IF circuit 450, and an ADC 574 similar to ADC 458. IF section 575 includes an IF circuit 577 similar to IF circuit 460, and an ADC 579 similar to ADC 468.

Input section 510 receives an RF input signal $RF_{IN}$. LNAs 512 through 514 each have an input for receiving signal $RF_{IN}$, and an output. Switch matrix 518 has a first input connected to the output of LNA 512, one or more additional inputs connected to the output of LNA 514, and a third input for receiving a switch matrix control signal labeled "SM CONTROL", a first through a fifth output, and an RF dump output labeled "$RF_{DUMP}$". RF sections 520, 530, 540, 550, and 560 each have an input for receiving an RF input signal that is connected to an outputs of switch matrix 518, such that the first output is connected to RF section 520, the second output is connected to RF section 530, the third output is connected to RF section 540, the fourth output is connected to RF section 550, and the fifth output is connected to RF section 560. RF sections 520, 530, 540, 550, and 560 also each have a first output for providing an in-phase IF signal, and a second output for providing a quadrature IF signal.

In each of RF sections 520 and 530, tracking bandpass filter 521 has a first input connected through switch matrix 518 and an LNA 512 through 514 to signal $RF_{IN}$, a second input for receiving a tuning signal (not shown in FIG. 5) similar to tuning signal $F_{BP}$, and an output. Attenuator 522 has a first input connected to the output of tracking bandpass filter 521, a second input for receiving an attenuation control signal (not shown in FIG. 5) similar to attenuation control signal ATTEN AGC, and an output. Filter 523 has a first input connected to the output of attenuator 522, a second input for receiving a cutoff frequency adjustment signal (not shown in FIG. 5) similar to cutoff frequency adjustment signal $F_{LP}$, and an output. Local oscillator 526 has an input for receiving a local oscillator tuning signal (not shown in FIG. 5) similar to local oscillator tuning signal $F_{LO}$, a first output for providing two mixing signals, including an in-phase mixing signal and a quadrature mixing signal, and a second output for providing a test signal TEST connected to the first input of tracking bandpass filter 521. Mixer 524 has a first input connected to the output of filter 523, a second input connected to the output of local oscillator 526, a first output for providing an in-phase IF signal, and a second output for providing a quadrature IF signal. Power detector 525 has an input connected to the output of filter 523, and an output. RF sections 540, 550, and 560 include elements that are connected together similarly to RF sections 520 and 530, except that, with no filter 523, the output of attenuator 522 is connected to the first input of mixer 524. In an alternative embodiment, filter 434 does not include a second input, but rather, is a lowpass filter with a cutoff frequency that is substantially equal to twice the frequency of the low end of the frequency range tuned by receiver 400.

Mixer load/I/Q combiner 528 has a first input pair connected to the first and second output of RF section 520, a second input pair connected to the first and second output of RF section 530, a third input pair connected to the first and second output of RF section 540, a fourth input pair connected to the first and second output of RF section 550, a fifth input pair connected to the first and second output of RF section 560, a sixth input for receiving a mixer load/I/Q combiner control signal labeled "MLC CONTROL", a first output for providing an in-phase IF signal, and a second output for providing a quadrature IF signal.

IF section 570 receives the in-phase IF signal output from mixer load/I/Q combiner 528, and provides an in-phase digital signal to demodulator 580. Thus, IF circuit 572 has an input for receiving the in-phase IF signal, and an output. ADC 574 has an input connected to the output of IF circuit 572, and an output for providing a digitized output signal. IF section 575 receives the quadrature IF signal output from mixer load/I/Q combiner 528, and provides a digital signal to demodulator 580. Thus, IF circuit 577 has an input for receiving the quadrature IF signal, and an output. ADC 579 has an input connected to the output of IF circuit 577, and an output for providing a digitized output signal. Demodulator 580 has a first input connected to the output of ADC 574, a second input connected to the output of ADC 579, and an output for providing a demodulated output signal labeled "$TV_{OUT}$".

MCU 590 has five inputs, each connected to the output of one power detector 525, five outputs for providing signals $F_{BP}$, five outputs for providing signals ATTEN AGC, two outputs for providing signals $F_{LP}$, five outputs for providing signals $F_{LO}$, an output connected to the fourth input of switch matrix 518 for providing signal SM CONTROL, and an output connected to the sixth input of mixer load/I/Q combiner 528 for providing signal MLC CONTROL. MCU 590 can implement signals $F_{BP}$, ATTEN AGC, $F_{LP}$, $F_{LO}$, SM CONTROL, and MLC CONTROL as discrete outputs, or signals $F_{BP}$, ATTEN AGC, $F_{LP}$, $F_{LO}$, SM CONTROL, and MLC CONTROL can be implemented by placing the appropriate signal values into buffer devices (not illustrated) which provide the outputs.

In operation, receiver 500 functions as a television receiver similar to receiver 400, being adapted to receive and demodulate television channels in the range of 48 MHz to 1 GHz. MCU 590 is adapted to control the various elements in receiver 500 according to the channel selected by the user. However, here, receiver 500 uses the dual filter architecture in RF sections 520 and 530, while RF sections 540, 550, and 560 use a single filter architecture for the pre-mixing tuner. It will be understood after reading this disclosure that different RF sections can be designed to provide filtering over a different portion of the 48 MHz to 1 GHz range, and that such design can be easier to achieve than with a single RF section. Here, RF sections 520, 530, 540, 550, and 560 are each designed to provide filtering and attenuation for a selected frequency range of signal $RF_{IN}$. For example, in the illustrated embodiment, a first RF section 520 provides filtering and attenuation in the range of 48 to 120 MHz, a second RF section 530 provides filtering and attenuation in the range of 120 to 240 MHz, a third RF section 540 provides filtering and attenuation in the range of 240 to 470 MHz, a fourth RF section 550 provides filtering and attenuation in the range of 470 to 685 MHz, and a fifth RF section 560 provides filtering and attenuation in the range of 685 MHz to 1 GHz.

LNAs 512 through 514 receive and amplify signal $RF_{IN}$. Receiver 500 implements a number of LNAs 512 through 514 that is proportional to the desired gain resolution (i.e., proportional to the number of gain steps desired). Switch matrix 518 receives the amplified signal $RF_{IN}$ from LNAs 512 through 514, and connects each LNA 512 through 514 to either the RF section 520, 530, 540, 550, or 560 that is designed to provide filtering and attenuation for the selected channel, or to the $RF_{DUMP}$ output under the control of MCU 590 via signal SM CONTROL. By switching more or less LNAs 512 and 514, receiver 500 is able to present signal $RF_{IN}$ to the input of the selected one of RF sections 520, 530, 540, 550, or 560 at a suitable power level for the selected tracking bandpass filter 521, and mixer 524. MCU 590 uses the inputs from the selected one of power detectors 525 to determine the number of LNAs 512 and 514 to switch to the input of the corresponding RF sections 520, 530, 540, 550, or 560, thus achieving digital automatic gain control in receiver 500. In another embodiment, not illustrated, one or more LNA is designed to provide variable linear amplification over a different portion of the 48 MHz to 1 GHz range. It will be understood after reading this disclosure that designing such LNAs is easier to achieve than designing a single LNA covering the entire gain and tuning range. Here switch matrix 518 receives signals from the LNAs 512 and 514 that together provide the desired amplification, and switches each of them to the RF section 520, 530, 540, 550, or 550 that is designed to provide filtering and attenuation for the selected channel. Further, MCU 590 controls the gain by controlling the switching properties of the switch matrix 518.

Each tracking bandpass filter 521 is a second-order LC filter that is implemented as an inductor with an array of switched capacitors, the selection of which functions to tune the center frequency of the passband of tracking bandpass filters 521 under the control of MCU 590 via signals $F_{BP}$, and is further implemented in part on an integrated circuit substrate containing the other elements of receiver 400, and part on an integrated passive device (IPD) die. Attenuators 522 function as separately controllable gain elements under the control of MCU 490 via signals ATTEN AGC. Filters 523 provide additional attenuation above the third harmonic of the mixing signal under the control of MCU 490 via signals $F_{LP}$ to prevent unwanted energy from a neighboring channel from being mixed into the passband. Again, this frequency is important because local oscillators 526 use a digital mixing signal that is a square wave, which has significant energy at its third harmonic. After reading this disclosure, it will be appreciated that a lowpass filter may not be necessary to filter third harmonics of the digital mixing signal frequency for RF sections that handle the higher frequency channels.

Mixers 524 are quadrature mixers that mix the filtered and attenuated RF input signal with the signal from local oscillators 526 to achieve a desired IF signal. Again, the desired IF is 4 MHz, and thus receiver 500 utilizes a low-IF architecture. To achieve the desired IF, local oscillators 526 are tuned to a frequency that mixes a selected channel to the low IF frequency of 4 MHz, under the control of MCU 490 via signal $F_{LO}$. In other embodiments, receiver 500 may use a high-IF or a direct down conversion architecture. Mixer load/I/Q combiner 528 receives the in-phase and quadrature IF signals from the selected mixer 524 and switches them to the in-phase IF section 570 and the quadrature IF section 575, respectively, under the control of MCU 590 via signal MLC CONTROL.

Each of IF circuits 572 and 577 perform further signal conditioning, including lowpass filtering to pass frequencies below a cutoff frequency of 7 MHz, and further attenuation. MCU 590 further has outputs, not shown in FIG. 5, for adjusting the gain of the signal through IF circuits 572 and 577. ADCs 574 and 579 convert their respective input signals to the digital domain, such that demodulator 580 can demodulate them digitally and provide signal $TV_{OUT}$.

As with receiver 400, receiver 500 is able to obtain high quality filtering and low signal-to-noise ratio while operating at low cost by using the tracking bandpass filter approach with an LC type filter. Again, the array of switched capacitors of tracking bandpass filters 521 are efficiently fabricated on a low cost CMOS receiver die that also includes input section 510, RF sections 520, 530, 540, 550, and 560, mixer load/I/Q combiner 528, IF sections 570 and 575, demodulator 580, and MCU 590. Likewise, the inductors of tracking bandpass filters 521 are efficiently fabricated on an integrated passive device (IPD) die. Thus, receiver 500 also achieves high quality at low cost.

However, unlike receiver 400 of FIG. 4, receiver 500 separates the receiver RF section in to five separate RF sections 520, 530, 540, 550, and 550 to relax the linearity requirements of the gain elements and tracking filters. This approach leads to further reduction in receiver die size and cost. In another embodiment (not illustrated), filters 523 can be included in additional RF stages 540, 550 or 560 in order to filter images from energy from outside of the 40 MHz to 1 GHz range (e.g., from cellular communications above 1 GHz).

Figure 6:
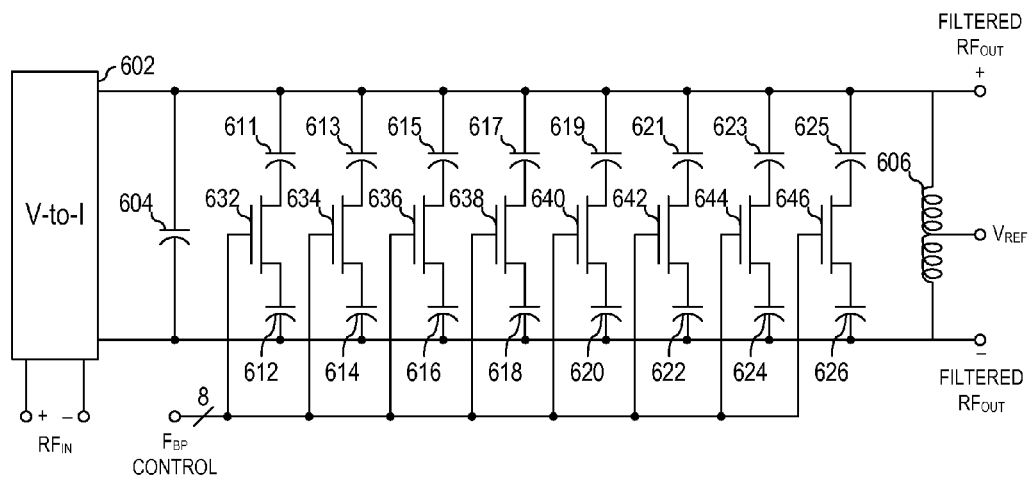
FIG. 6 illustrates in schematic form one of the tracking bandpass filters of FIGS. 4 and 5.

FIG. 6 illustrates in schematic form an embodiment of a tracking bandpass fitter 600 suitable for use as tracking bandpass filters 420 and 521 of FIGS. 4 and 5, respectively, and incorporating an array of switched capacitors to achieve center frequency tuning. As illustrated, tracking bandpass filter 600 includes a voltage to current (V-to-I) converter 602, a capacitor 604, an inductor 606, capacitors 611 through 626, and transistors 632, 634, 636, 638, 640, 642, 644, and 646. V-to-I convert 602 has a differential input for receiving an RF input signal labeled "$RF_{IN}$", and a differential output for providing an RF output signal labeled "FILTERED $RF_{OUT}$". Tracking bandpass filter 600 also includes an input for receiving a transistor control signal labeled "$F_{BP}$ CONTROL", and an input for receiving a reference voltage labeled "$V_{REF}$". Capacitor 604 is connected between the differential output of V-to-I converter 602. Inductor 606 is also connected between the differential output of V-to-I converter 602, and has a center tap for receiving reference voltage $V_{REF}$. Capacitors 611, 613, 615, 617, 619, 621, 623, and 625 each include a first terminal connected to the positive side of the differential output of V-to-I converter 602, and a second terminal. Capacitors 612, 614, 616, 618, 620, 622, 624, and 626 each include a first terminal connected to the negative side of the differential output of V-to-I converter 602, and a second terminal. Transistors 632, 634, 636, 638, 640, 642, 644, and 646 are field effect transistors (FETs) that each include a first source/drain terminal connected to the second terminals of capacitors 611, 613, 615, 617, 619, 621, 623, and 625, a gate for receiving the respective one of signal $F_{BP}$, and a second source/drain terminal connected to the second terminals of capacitors 612, 614, 616, 618, 620, 622, 624, and 626.

In operation, tracking bandpass filter 600 tunes its center frequency by switching on one or more of transistors 632, 634, 636, 638, 640, 642, 644, and 646. Transistors 632, 634, 636, 638, 640, 642, 644, and 646 are switched on or off based upon the state of the individual gate of each transistor 632, 634, 636, 638, 640, 642, 644, and 646. In one embodiment, the capacitance of capacitors 612 through 626 can be equal to each other (e.g., 1 picofarad (pF)), and so the overall capacitance is 1 pF when only one transistor is on, 2 pF when two transistors are on, and so on until, where all eight transistors are on, the overall capacitance is 8 pF, and tracking bandpass filter 600 can tune to eight different channels. In another embodiment, tracking bandpass filter 600 can tune to more or less than eight different channels by adding or removing additional capacitor/transistor elements. In yet another embodiment, the capacitors can be binarily weighted, such that the capacitance of capacitors 613 and 614 can be twice the capacitance of capacitors 611 and 612, the capacitance of capacitors 615 and 616 can be twice the capacitance of capacitors 613 and 614, and so on through to capacitors 625 and 626 (e.g., capacitors 611 and 612=1 pF, capacitors 613 and 614=2 pF, capacitors 615 and 616=4 pF, capacitors 617 and 618=8 pF, capacitors 619 and 620=16 pF, capacitors 621 and 622=32 pF, capacitors 623 and 624=64 pF, and capacitors 625 and 626=128 pF). In this way, switching on various combinations of transistors 632, 634, 636, 638, 640, 642, 644, and 646 permits 256 different capacitance values for tracking bandpass filter 600. It will be understood after reading this disclosure that the transistors 632, 634, 636, 638, 640, 642, 644, and 646 can be implemented as P-channel field effect transistors (pFETs), bipolar junction transistors, or other transistor types, as dictated by the design and fabrication considerations of the receiver incorporating the tracking bandpass filter 600.

Incorporating switched capacitors to tune the center frequency of the passband permits tracking bandpass filter 600 to be more fully integrated into a receiver die. This is because the switched capacitor array replaces the varactors of receiver 100 and receiver 300, and eliminates the need for a DC-DC converter. Additionally, the receiver die fabrication technology can be chosen to optimize performance RF performance. Since capacitors are more easily implemented than inductors, using switched capacitors to change the center frequency of tracking bandpass filter 600 makes the architecture of receivers 400 and 500 easy to implement in an integrated circuit.

Figure 7:
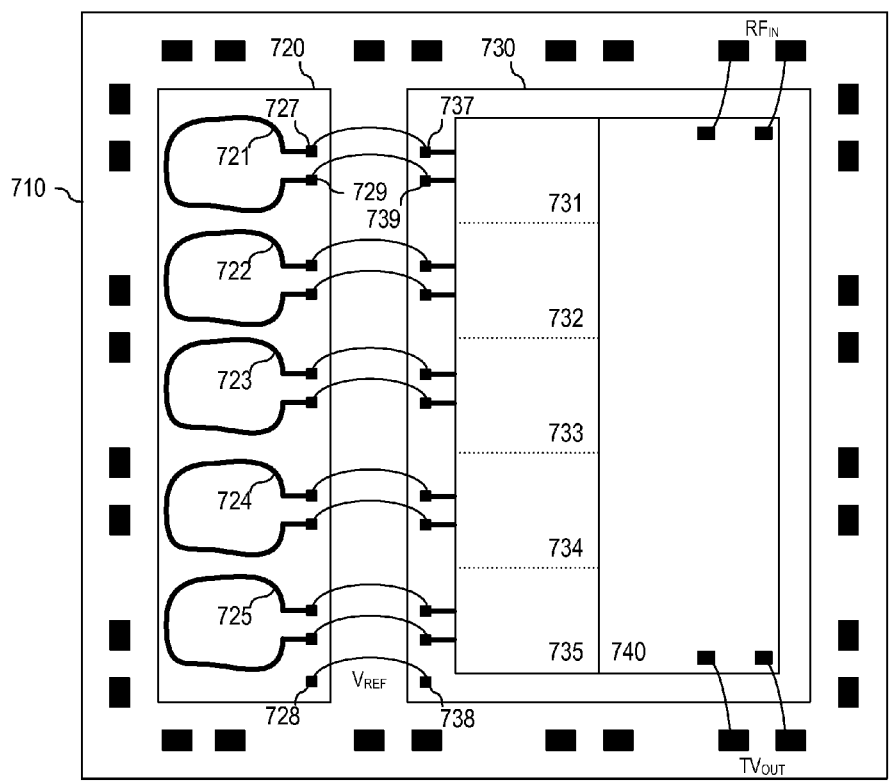
FIG. 7 illustrates a top view of a multi-chip module (MCM) incorporating the receiver of FIG. 5.

FIG. 7 illustrates a top view of a multi-chip module (MCM) 700 incorporating the receiver of FIG. 5, wherein the tracking bandpass filters are implemented using both an IPD die and a receiver die. The elements of MCM 700 are representative, and are not shown in their actual sizes or proportions. MCM 700 includes a substrate 710, an IPD die 720, and a receiver die 730. IPD die 720 and receiver die 730 are mounted to substrate 710. IPD die 720 includes inductors 721, 722, 723, 724, and 725, and a bond pad 728 for receiving reference voltage $V_{REF}$. Each inductor 721, 722, 723, 724, and 725 has a pair of bond pads, shown typically on inductor 721 as bond pads 727 and 729. Receiver die 730 includes switched capacitor arrays 731, 732, 733, 734, and 735, and a bond pad 738 for supplying reference voltage $V_{REF}$. Each switched capacitor array 731, 732, 733, 734, and 735 has a pair of bond pads, shown typically on switched capacitor array 731 as bond pads 737 and 739. Each inductor 721, 722, 723, 724, and 725 is connected to a switched capacitor array 731, 732, 733, 734, and 735, respectively, such that a first connection is made between the bond pad 727 and bond pad 737, and a second connection is made between the bond pad 729 and bond pad 739. Switched capacitor arrays 731, 732, 733, 734, and 735 are connected to the rest of the receiver circuitry 740 on the die level. The rest of the receiver circuitry 740 is also configured to receive an RF input signal $RF_{IN}$, and to provide a television output signal $TV_{OUT}$.

By integrating an input section with LNAs and a switch matrix, multiple RF sections with the switched capacitor array portions of tracking bandpass filters, attenuators, and lowpass filters, a mixer load/I/Q combiner, IF sections, demodulator and MCU on a single receiver die 730, and the inductor portions of tracking bandpass filters on an IPD die, greater levels of integration, size and cost reduction are achieved. Moreover, complimentary metal-oxide-semiconductor (CMOS) manufacturing processes require many process steps for formation of transistors and interconnects. The inductors are formed on a low cost IPD die since inductors do not need many of the CMOS processing steps. However, MCM 700 appears to be a single integrated circuit to the user.

Note that in other embodiments, the inductors on IPD 720 could be implemented in other ways within MCM 700. For example, inductors 721-725 could be implemented as discrete inductors, as traces in the substrate of MCM 700, and in other ways.

Figure 8:
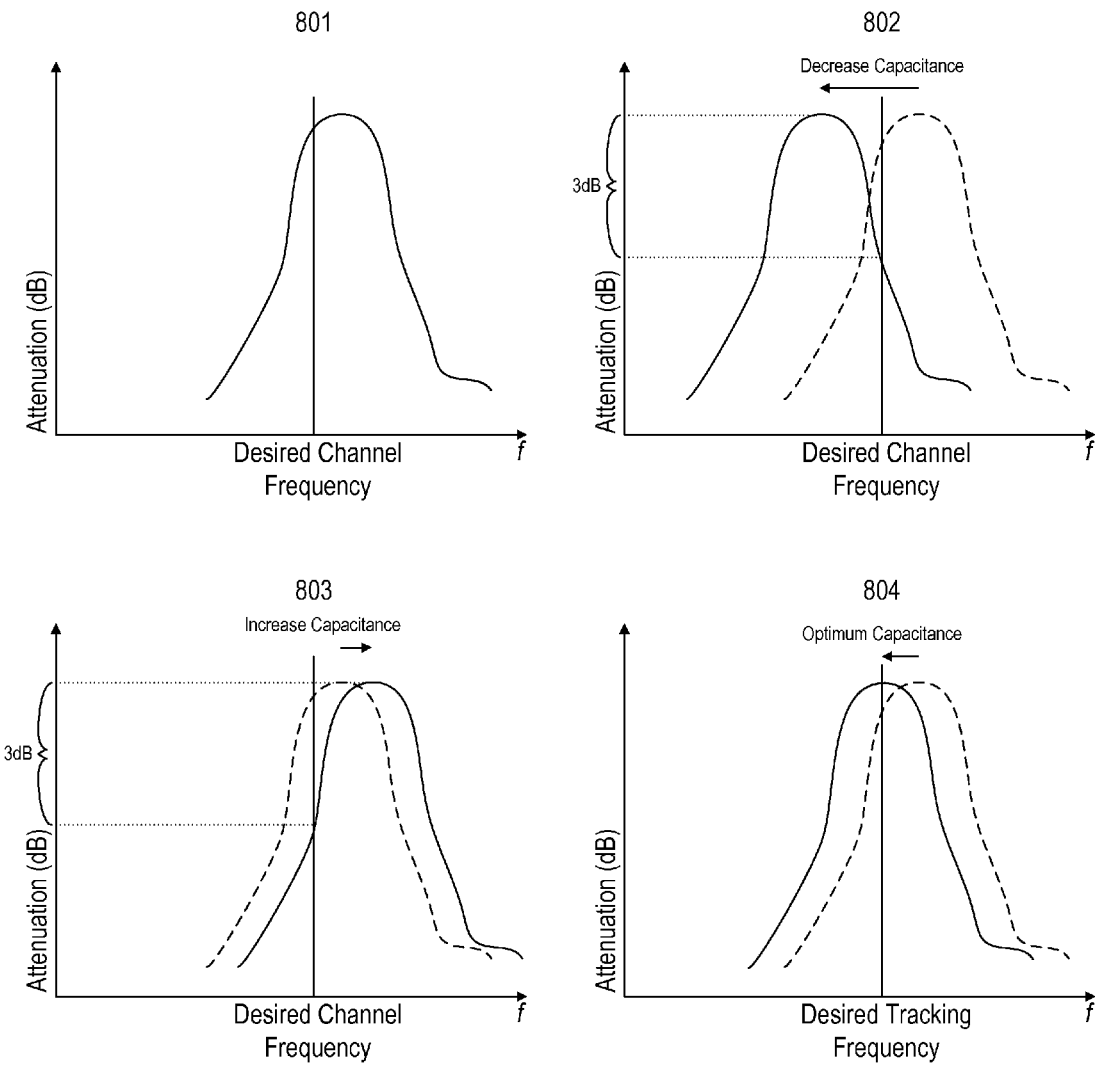
FIG. 8 illustrates a graph of the variation in passband response of the filter of FIG. 6 as capacitance is varied that is useful in understanding a calibration procedure therefor.

FIG. 8 illustrates graphs of the variation in frequency response of the filter of FIG. 6 as capacitance is varied and is useful in understanding a calibration procedure therefore. A graph 801 illustrates the tracking bandpass filter 600. The vertical axis represents attenuation in dB and the horizontal axis represents the frequency f in MHz. The spectrum for a desired channel is created by providing a test tone from the local oscillator 442 or 526, and the resulting power output is measured by the power detector 491 or 525. Note that the tracking bandpass filter passes more RF energy at frequencies above the desired channel frequency than below the desired frequency. It is desirable to balance the RF energy passed above the desired channel frequency with the energy passed below the desired frequency, or, in other words, to center the tracking bandpass filter.

To center the bandpass tracking filter, the MCU finds the peak power level, and the low and high frequency roll-off by switching off capacitors in the switched capacitor array, moving the attenuation curve to the left as illustrated in the graph 802, and switching on capacitors in the switched capacitor array, moving the attenuation curve to the right as illustrated in the graph 803. As the MCU switches capacitors off and on, the power detector measures the output power of the tracking bandpass filter, and the MCU can thus determine which switch combination results in the peak power output, the low frequency roll-off point and the high frequency roll-off point.

The low and high frequency roll-off points can be defined, for example, as the points where the power level is −3 dB below the peak power. In a particular embodiment, the center of the attenuation curve is determined by setting the capacitance of the tracking bandpass filter to be the capacitance level that is halfway between the capacitance level of the low frequency roll-off point and the capacitance level of the high frequency roll-off point, as illustrated in the graph 804. In another embodiment, the MCU can record the power level of each switch combination, to determine if one side of the attenuation curve rolls off faster than the other, and can apply an appropriate correction factor in determining the center of the attenuation curve.

The above-disclosed subject matter is to be considered illustrative, and not restrictive, and the appended claims are intended to cover all such modifications, enhancements, and other embodiments that fall within the true scope of the claims. Thus, to the maximum extent allowed by law, the scope of the present invention is to be determined by the broadest permissible interpretation of the following claims and their equivalents, and shall not be restricted or limited by the foregoing detailed description.

What is claimed is:

1. A receiver, comprising:
   a tracking bandpass filter having a first input for receiving a radio frequency (RF) input signal, and an output, wherein said tracking bandpass filter comprises:
   a first portion disposed on a semiconductor die; and
   at least one inductor disposed on an integrated passive device (IPD) die, said at least one inductor operatively coupled to said first portion of said tracking bandpass filter, and
   a signal processing circuit intergrated on said semiconductor die and having an input coupled to said output of said tracking bandpass filter, and an output for providing a processed signal,
   said semiconductor die and said IPD die integrated into a single multi-chip module (MCM).

2. The receiver of claim 1, wherein said tracking bandpass filter is characterized as being an L-C type bandpass filter.

3. The receiver of claim 2, wherein said first portion comprises a switched capacitor array.

4. The receiver of claim 3, wherein:
   said tracking bandpass filter further has a second input for receiving a center frequency adjustment signal; and
   the receiver further comprises a microcontroller having an output operably coupled to said second input of said tracking bandpass filter for adjusting a center frequency of said tracking bandpass filter.

5. The receiver of claim 4, wherein:
   said microcontroller further has an input; and
   the receiver further comprising a power detector having an input coupled to said output of said tracking bandpass filter, and an output coupled to said input of said microcontroller.

6. The receiver of claim 5, wherein said microcontroller is adapted to adjust said center frequency of said tracking bandpass filter based upon the power level at said output of said tracking bandpass filter, as measured by said power detector.

7. The receiver of claim 6, wherein said microcontroller is adapted to adjust said center frequency of said tracking bandpass filter by controlling said switched capacitor array.

8. The receiver of claim 1, wherein said tracking bandpass filter is characterized as being second order.

9. A receiver comprising:
a tracking bandpass filter having a first input for receiving a radio frequency (RF) input signal, a second input for receiving a center frequency adjustment signal, and an output, wherein said tracking bandpass filter comprises:
a first portion disposed on a semiconductor die; and
at least one inductor disposed on an integrated passive device (IPD) die, said at least one inductor operatively coupled to said first portion of said tracking bandpass filter;
a power detector having an input coupled to said output of said tracking bandpass filter, and an output;
a signal processing circuit having an input coupled to said output of said tracking bandpass filter, and an output for providing a processed signal; and
a microcontroller having an input coupled to said output of said power detector, and an output coupled to said second input of said tracking bandpass filter for adjusting a center frequency of said tracking bandpass filter; and
wherein said semiconductor die and said (PD die integrated into a single multi-chip module (MCM).

10. The receiver of claim 9, wherein said tracking bandpass filter is characterized as being an L-C type bandpass filter.

11. The receiver of claim 10, wherein said first portion comprises a switched capacitor array.

12. The receiver of claim 11, wherein said microcontroller is adapted to adjust said center frequency of said tracking bandpass filter based upon the power level at said output of said tracking bandpass filter, as measured by said power detector.

13. The receiver of claim 12, wherein said microcontroller is adapted to adjust said center frequency of said tracking bandpass filter by controlling said switched capacitor array.

14. The receiver of claim 9, wherein said tracking bandpass filter is characterized as being second order.

15. A receiver, comprising:
a low noise amplifier having a first input for receiving a radio frequency (RF) input signal, a second input for receiving a gain adjustment signal, and an output;
a tracking bandpass filter having a first input coupled to said output of said low noise amplifier, a second input for receiving a center frequency adjustment signal, and an output, wherein said tracking bandpass filter comprises:
a first portion disposed on a semiconductor die; and
at least one inductor disposed on an integrated passive device (IPD) die, said at least one inductor operatively coupled to said first portion of said tracking bandpass;
a local oscillator having an input for receiving a local oscillator frequency adjustment signal, and a first output for providing a first local oscillator signal at a frequency chosen to mix said output of said tracking bandpass filter to a desired intermediate frequency (IF);
a mixer having a first input coupled to said output of said tracking bandpass filter, a second input coupled to said first output of said local oscillator, and a first output for providing a first IF signal at said desired intermediate frequency;
a signal processing circuit having a first input coupled to said first output of said mixer, and an output for providing a processed signal; and
a microcontroller having:
a first output coupled to said second input of said low noise amplifier for adjusting said gain of said low noise amplifier;
a second output coupled to said second input of said tracking bandpass filter for adjusting said center frequency of said tracking bandpass filter; and
a third output coupled to said input of said local oscillator for adjusting said first local oscillator frequency of said local oscillator; and wherein said semiconductor die and said IPD die are integrated into a single package.

16. The receiver of claim 15, wherein said semiconductor die further comprises said low noise amplifier, said first portion of said tracking bandpass filter, said local oscillator, said mixer, said signal processing circuit, and said microcontroller.

17. The receiver of claim 16, wherein said first local oscillator signal is characterized as being a square wave signal.

18. The receiver of claim 16, further comprising:
a lowpass filter having a first input coupled to said output of said tracking bandpass filter, a second input for receiving a corner frequency adjustment signal, and an output coupled to said input of said mixer; and
said microcontroller further having a fourth output coupled to said second input of said lowpass filter for adjusting a corner frequency of said lowpass filter.

19. The receiver of claim 18, wherein said semiconductor die further comprises said lowpass filter.

20. The receiver of claim 16, wherein:
said local oscillator further has a second output for providing a second local oscillator signal in quadrature with said first local oscillator signal;
said mixer having a third input coupled to said second output of said local oscillator, and a second output for providing a second IF signal at said desired intermediate frequency; and
said signal processing circuit having a second input coupled to said second output of said mixer.

* * * * *

UNITED STATES PATENT AND TRADEMARK OFFICE
CERTIFICATE OF CORRECTION

PATENT NO. : 8,145,172 B2  Page 1 of 1
APPLICATION NO. : 12/277866
DATED : March 27, 2012
INVENTOR(S) : Khoini-Poorfard et al.

It is certified that error appears in the above-identified patent and that said Letters Patent is hereby corrected as shown below:

In column 13, line 59, replace "fitter" with "filter".

In column 16, line 30, replace "handpass" with "bandpass".

In column 17, line 20, replace "(PD" with "IPD".

In column 17, line 47, add "filter" after the word "bandpass" and before the ";".

Signed and Sealed this
Eighth Day of May, 2012

David J. Kappos
*Director of the United States Patent and Trademark Office*